United States Patent
Nulman

(10) Patent No.: US 6,361,618 B1
(45) Date of Patent: Mar. 26, 2002

(54) METHODS AND APPARATUS FOR FORMING AND MAINTAINING HIGH VACUUM ENVIRONMENTS

(75) Inventor: Jaim Nulman, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/338,468

(22) Filed: Jun. 22, 1999

Related U.S. Application Data

(60) Division of application No. 08/620,634, filed on Mar. 22, 1996, which is a continuation-in-part of application No. 08/277,881, filed on Jul. 20, 1994.

(51) Int. Cl.$^7$ .................................................. B08B 5/04

(52) U.S. Cl. ........................ 134/21; 134/19; 134/22.1

(58) Field of Search .................... 134/21, 1.2, 22.1, 134/19; 438/905

(56) References Cited

U.S. PATENT DOCUMENTS

| | | |
|---|---|---|
| 3,625,019 A | 12/1971 | Osterstrom |
| 3,892,650 A | 7/1975 | Cuomo et al. |
| 3,924,967 A | 12/1975 | Harra |
| 4,137,012 A | 1/1979 | della Porta et al. |
| 4,255,465 A | 3/1981 | Bernard et al. |

(List continued on next page.)

FOREIGN PATENT DOCUMENTS

| | | |
|---|---|---|
| FR | 2 511 709 | 2/1983 |
| JP | 58-117371 | 7/1983 |
| JP | 58117372 | 7/1983 |
| JP | 60222572 | 11/1985 |
| JP | 62113876 | 5/1987 |

OTHER PUBLICATIONS

"System Grows Complex Single Crystal Materials," Solid State Technology, Jul. 1983, USA, vol. 26, No. 7, pp. 39–40.

S. Ueda, et al., "A High Performance Molecular Beam Epitaxy System Equipped With The Automatic Substrate Transport Mechanism," Journal Of Vacuum Science & Technology, May–Jun. 1986, USA, No. 3, Part 1, pp. 602–605.

"Non–Evaporable Getter Pumps For Semiconductor Processing Equipment," Ultra Clean Technology, 1990, vol. 1, No. 1, pp. 49–57.

"Getter Wafer Module And Panels," Saes Getters S.p.A.

P. della Porta, "'Gettering' an Integral Part of Technology," Nov. 1992, Saes Getters S.p.A.

Briesachar, et al., "Recommended Pumping Semiconductor Manufacturing," Kayoiku Kaikan, 'Applications for Non–Evaporable Getter Pumps in Semiconductor Processing Equipment' 10$^{th}$ Symposium on ULSI Ultra Clean Technology.

Sciuccati, et al., "In situ Pumping With NEG (Non–Evaporable Getters) During Vacuum Processing," Vacuum, vol. 38, Nos. 8–10, pp. 765–769.

*Primary Examiner*—Randy Gulakowski
*Assistant Examiner*—Saeed T Chaudhry
(74) *Attorney, Agent, or Firm*—Moser, Patterson & Sheridan, LLP

(57) ABSTRACT

Methods and Apparatus for forming and maintaining high vacuum environments are provided. In one aspect, a method is provided for forming and maintaining a vacuum in a processing chamber including evacuating the processing chamber with a vacuum pump to a first chamber pressure and removing gaseous material from the chamber volume with a getter material to reduce the chamber pressure to a second chamber pressure less than the first chamber pressure. The method may further include providing a substrate in the processing chamber and raising the temperature of the substrate and/or processing chamber to a temperature sufficient to outgas contaminants in the substrate and processing chamber components.

17 Claims, 2 Drawing Sheets

U.S. PATENT DOCUMENTS

| | | |
|---|---|---|
| 4,379,832 A | 4/1983 | Dalal et al. |
| 4,631,002 A | 12/1986 | Pierini |
| 4,733,631 A | 3/1988 | Boyarsky et al. |
| 4,843,029 A | 6/1989 | Joyce et al. |
| 4,873,833 A | 10/1989 | Pfeiffer et al. |
| 4,910,965 A | 3/1990 | Lepofsky et al. |
| 5,019,233 A | 5/1991 | Blake et al. |
| 5,039,657 A | 8/1991 | Goldman et al. |
| 5,108,792 A | 4/1992 | Anderson et al. |
| 5,135,634 A | 8/1992 | Clarke |
| 5,154,582 A | 10/1992 | Danielson |
| 5,161,955 A | 11/1992 | Danielson et al. |
| 5,186,718 A * | 2/1993 | Tepman et al. ............. 29/25.01 |
| 5,228,501 A * | 7/1993 | Tepman et al. ............. 165/80.1 |
| 5,294,320 A * | 3/1994 | Somekh et al. ......... 204/298.11 |
| 5,320,496 A | 6/1994 | Manini et al. |
| 5,357,760 A | 10/1994 | Higham |
| 5,370,739 A | 12/1994 | Foster et al. |
| 5,778,682 A | 7/1998 | Ouellet |
| 5,843,239 A * | 12/1998 | Shrotriya .................... 134/1.1 |
| 6,193,811 B1 * | 2/2001 | Sundarrajan et al. ......... 134/19 |
| 6,214,720 B1 * | 4/2001 | Sill et al. .................... 438/622 |

\* cited by examiner

METHODS AND APPARATUS FOR FORMING AND MAINTAINING HIGH VACUUM ENVIRONMENTS

This is a divisional of copending application Ser. No. 08/620,634 filed on Mar. 22, 1996 which is a continuation-in-part application of U.S. patent application Ser. No. 08/277,881 filed on Jul. 20, 1994, entitled "Method for Reduction of Base Pressure in Vacuum Chambers with Hot Surfaces".

BACKGROUND OF THE INVENTION

1. Field of the Invention

The present invention relates to vacuum processing equipment. More particularly, the present invention relates to the creation and maintenance of high vacuum environments in which substrates, including semiconductor substrates, may be degassed or cleaned before processing by sputtering or other film layer deposition or etching processes. More particularly still, the present invention relates to a method of removing contaminants outgassed from a substrate in a degas chamber through placement of a getter pump in the de-gas chamber.

2. Background of the Invention

Thin film deposition apparatus and techniques are used, among other techniques, to provide film layers on semiconductor substrates. An environment in which desired materials are transported in an ultrahigh vacuum to condense on a clean substrate is a preferred processing technique in the fabrication of microdevices. One well known prior art deposition process is sputtering where substrates are typically moved through load locks and into high vacuum processing chambers which enclose the substrate and a target composed of the material desired to be deposited on the substrate. A negative voltage applied to the target excites into a plasma state an inert gas (typically argon) supplied to the chamber. Ions from the plasma bombard the target and eject particles of target material from the target toward the substrate. These particles deposit on the substrate to form the desired film. In some sputtering process applications, the substrate may be heated to temperatures on the order of about 350° C. to about 510° C. or higher, to reflow a film layer deposited on the substrate by sputtering.

The low pressure, high temperature environments typically utilized in deposition processes cause outgassing of contaminants in the substrates, as well as the components of the deposition chamber. These contaminants, such as hydrogen ($H_2$), water ($H_2O$) and air (mostly $O_2$ and $N_2$), are detrimental to the film layer which is deposited onto the substrate. Therefore, processes for removing contaminants prior to processing have been developed to reduce the problem of contamination in processing environments. Such processes typically are confined to degas chambers located near the front of a cluster tool or otherwise in the preliminary steps of substrate processing.

Typically, substrates are housed in degas chambers and subjected to processing conditions, such as low pressure and high temperature, for a period of time prior to processing of outgas contaminants therefrom. Such processes typically include heating the substrates to a temperature at least as high as the processing temperature to which the wafer will be subjected in a low pressure chamber environment. The result of heating the substrate at low pressure is outgassing of contaminants such as hydrogen, $H_2O$ and air from the substrate. The theory being that by subjecting the substrate to at least the processing temperature at low pressure all contaminants that would be outgassed during processing at this temperature and pressure will have already been removed from the substrate by the time processing occurs. Following outgassing of contaminants, the substrate is moved through a load lock and into a processing chamber where processing occurs.

Having the substrate surface atomically clean before processing can be of vital importance for adhesion of subsequently deposited films and determining other physical properties that are dependent on the interface between the substrate and the film, such as electrical contact. However, the contaminants which are outgassed from the substrate must be removed from the degas chamber to maintain the required vacuum level therein, and also to prevent migration out of the degas chamber and into the load lock area between the pre-processing apparatus and the processing apparatus. This problem exists in applications where wafer exchange in and out of the degas chamber is controlled via a slit valve in the degas chamber and where a slit valve is absent.

It is necessary, therefore, that the substrates on which the processing steps are typically performed must first be degassed because the low pressure, high temperature environments in which most processing steps are performed will otherwise outgas contaminants and compromise the integrity of the devices formed on the substrate. Therefore, the substrates must be degassed before introduction into the processing chamber to prevent contamination of both a film subsequently deposited on the substrate and the surface of the substrate of the interface between the film and the substrate.

Processing systems for workpieces such as semiconductor substrates incorporate multiple, isolated vacuum stages between the cassette load lock station and the main vacuum processing chambers. A vacuum gradient is applied between the cassette load lock and the main processing chambers to facilitate the use of a very high degree of vacuum in the processing chambers without lengthy pump down times. Pre-treatment chambers, such as degas chambers, are typically incorporated in the transport paths. One such processing system is described in U.S. Pat. No. 5,186,718, Tepman et al., issued on Feb. 16, 1993, the subject of which is hereby incorporated herein by reference. Pre-treatment chambers can be dedicated to pre-treating (e.g., plasma etch cleaning, vacuum cleaning and/or heating) of the substrates before processing.

A combination of a roughing pump and a cryogenic pump is typically used to provide the vacuum in the degas chamber. Where the chamber is maintained at a temperature of below approximately 300° C., the roughing pump can reduce the pressure within the chamber to about $10^{-3}$ torr, and the cryogenic pump can then reduce the chamber pressure to a pressure on the order of $10^{-8}$ torr.

To minimize the inclusion of impurities or contaminants in the film deposited on the substrate, it is generally considered desirable to maintain the sputtering chamber at the highest possible vacuum, that is, the lowest possible pressure. However, the greater the vacuum in the chamber and the higher the temperature in the chamber, the greater the influx of undesirable contaminants, such as $H_2O$ and air, into the chamber due to outgassing from the substrates.

Because of the low condensation temperature of hydrogen, cryogenic pumps are relatively ineffective at removing hydrogen. The difficulty of maintaining a sufficiently low partial pressure of hydrogen has limited the ability of existing sputtering chambers to operate at high temperatures and ultra-high vacuums.

Sputter deposition of aluminum films on semiconductor substrates is an application in which ultra-high vacuum at high temperatures is especially desirable. The ultra high vacuum is used to achieve outgassing of contaminants and removal thereof from the chamber. The chamber pressure for sputtering, commonly as high as the milli-torr range, is commonly achieved by first evacuating the chamber to an ultra high vacuum pressure as low as the $10^{-8}$ torr range to remove contaminants from the chamber, and then re-filling ("back filling") the chamber with a clean process gas at a total chamber pressure regulated at about $10^{-3}$ torr.

High substrate temperatures are used to enhance the step coverage of the deposited film, that is, to improve the ability of the film to completely fill holes and trenches in the surface of the semiconductor substrate. Higher temperatures promote the diffusion of deposited atoms, called "reflow," to fill any gaps in, and equalize the thickness of the film as it is being deposited onto the substrate. Lower chamber pressures promote reflow of the deposition material on the substrate by reducing the occurrence of reflow inhibiting contaminants on the substrate surface. Reflow may occur simultaneously with the deposition of the film layer, at the end of the deposition step, or in a separate chamber dedicated to reflow.

For aluminum reflow, the substrate generally is heated by heating the pedestal which holds the substrate during processing. Consequently, existing sputter deposition chambers have achieved a chamber pressure of about $1.5 \times 10^{-8}$ torr at a substrate temperature of 510° C., where the pedestal is maintained at a temperature of approximately 580° C. At this temperature and pressure, contaminants not previously removed from the substrate during the degas process will be outgassed during processing, thereby compromising the integrity of the devices formed on the substrate.

Therefore, there is a need to provide a method and apparatus for outgassing contaminants from the substrate and removing the contaminants which are outgassed from the substrte to prevent migration of the contaminants out of the degas chamber during wafer exchange or due to the lack of a slit valve. By outgassing and removing the contaminants from the degas chamber, the quality of the deposition layers, and devices formed as a result of such deposition, will be greatly improved.

SUMMARY OF THE INVENTION

The present invention is directed to a degas chamber wherein substrates are outgassed and getter material is disposed adjacent to the substrate to remove contaminants, such as hydrogen and $H_2O$ which are outgassed from the substrate into the chamber volume and which when outgassed in the processing chamber, might compromise the integrity of devices formed on the substrate, and limit the ability to reach base pressure.

The invention provides a vacuum producing apparatus, an enclosure, a vacuum pump ported to the enclosure and capable of evacuating the enclosure to a first vacuum pressure, and getter material received within the enclosure for chemisorbing reactive gas species in the chamber.

One embodiment of the invention provides an apparatus for maintaining a vacuum pressure in a processing chamber for processing semiconductor substrates having a film layer thereon, comprising: an evacuable enclosure; a heating member to heat a substrate, when received in the enclosure, to a temperature high enough to effect outgassing of contaminants in the substrate; a vacuum pump disposed in communication with the enclosure and capable of reducing the pressure in the enclosure to a first pressure at a substrate outgassing temperature; and getter material disposed in the enclosure and capable of further reducing the pressure within the enclosure from the first pressure to a second pressure below the first pressure at a substrate outgassing temperature.

Another embodiment of the invention provides an apparatus having an evacuable enclosure for receiving a substrate and outgassing contaminants in the substrate, comprising: a vacuum pump ported to the enclosure and capable of evacuating the enclosure to a first vacuum pressure; getter material in communication with the enclosure and capable of reducing the pressure in the enclosure from the first pressure to a second, lower, pressure; and a heater capable of heating the substrate, when received in the enclosure, to a temperature sufficient to outgas contaminants in the substrate.

Yet another embodiment of the invention provides a method of providing a vacuum in a degas chamber, comprising the steps of: evacuating the chamber with a vacuum pump wherein the vacuum pump is alone capable of reducing the chamber pressure to a first chamber pressure; and removing gaseous material from the chamber volume with a getter material so as to reduce the chamber pressure to a pressure less than the first chamber pressure.

Yet another embodiment of the invention provides a method of outgassing a semiconductor substrate at high vacuum and high temperature, comprising: providing a chamber; evacuating the chamber with a vacuum pump wherein the vacuum pump is alone capable of reducing the chamber pressure to a first chamber pressure; absorbing gases in the chamber with a getter material so as to reduce the chamber pressure to a pressure less than the first chamber pressure; providing a semiconductor substrate in the chamber; and raising the temperature of the substrate from an ambient temperature to a temperature high enough to outgas contaminants in the substrate.

DETAILED DESCRIPTION OF THE PREFERRED EMBODIMENTS

Figure 1:
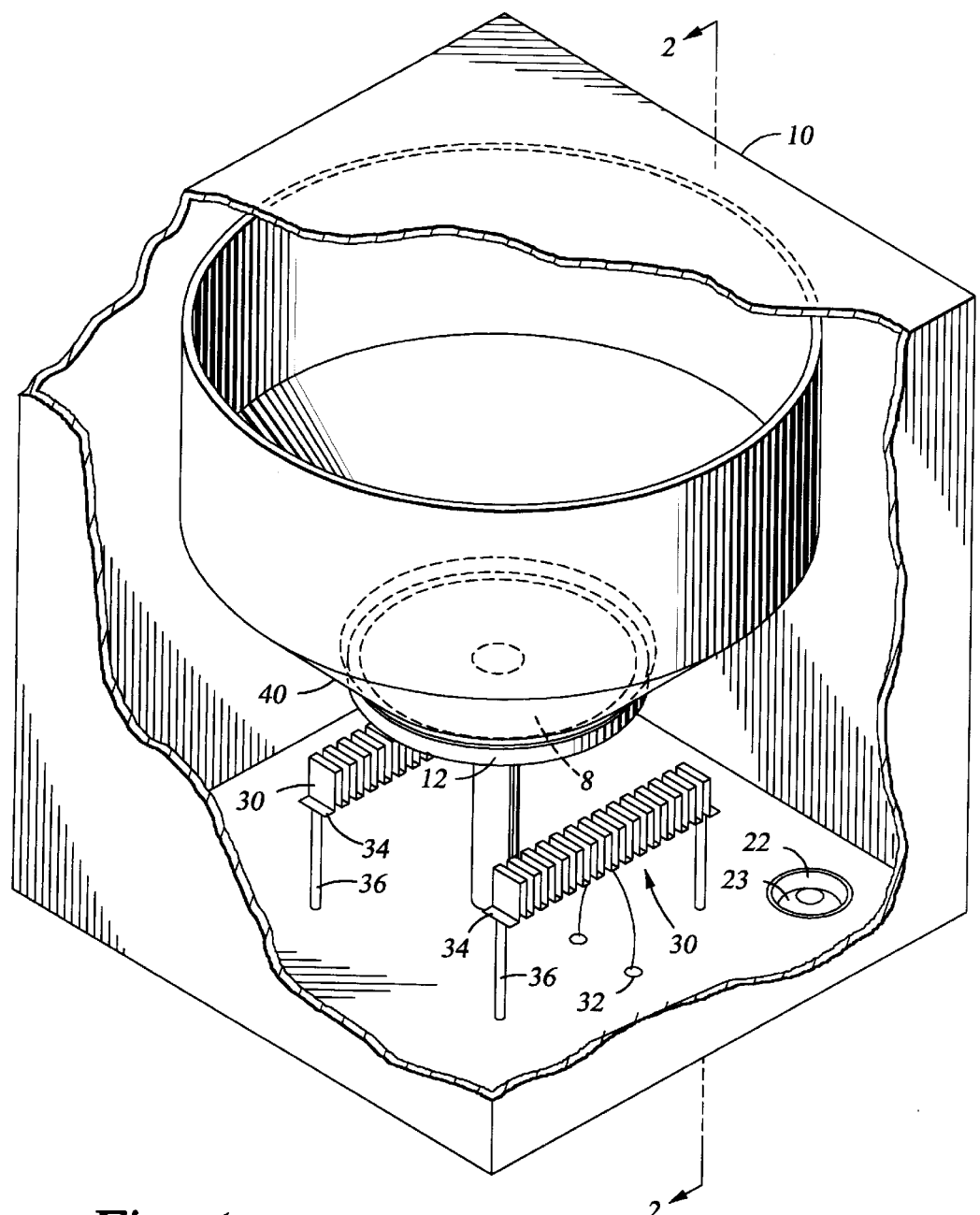
FIG. 1 is a perspective view, partially in section, of a representative degas chamber of the present invention.
Figure 2:
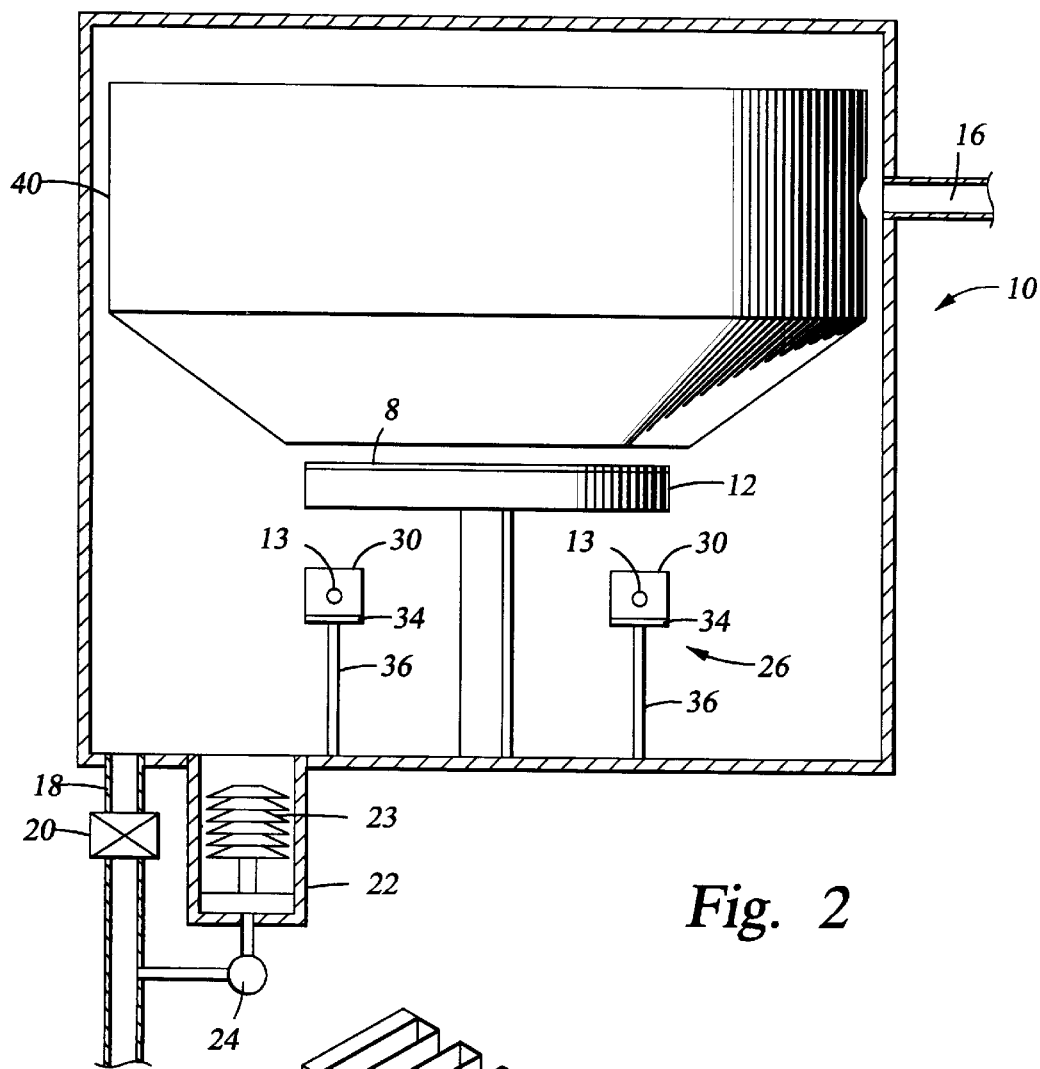
FIG. 2 is a partial sectional view of the representative degas chamber of the present invention, showing the getter pump in section and a heater pedestal.

FIGS. 1 and 2 depict a degas chamber 10 for outgassing semiconductor substrates 8. The degas chamber 10 includes a substrate support member or pedestal 12 and an exhaust port 18 (shown only in FIG. 2). The pedestal 12 preferably is internally heated. The pedestal 12 includes a conventional internal heater (not shown) such as that described in U.S. Pat. No. 5,228,501, Tepman, the disclosure of which is incorporated herein by reference. In addition, the substrate may be heated by absorbing lamp radiation from a lamp positioned above the substrate in the degas chamber.

To pump the degas chamber 10 down to the ultra high vacuum, the degas chamber 10 includes a roughing pump 20 ported to the chamber exhaust port 18, a vacuum pump 22, such as a cryogenic pump, ported to the exhaust port 18 through a valve 24, and getter material 26 disposed within the degas chamber 10 adjacent, and preferably below, the pedestal 12.

The purpose of the roughing pump 20 is to initially reduce the degas chamber pressure to a level at which a vacuum pump, such as a cryogenic pump, can operate effectively, typically about $1\times10^{-3}$ torr. The vacuum pump 22 is then engaged to reduce the degas chamber pressure down to a pressure as low as approximately $7\times10^{-9}$ torr. The getter material 26 functions to remove hydrogen, water ($H_2O$) and other reactive gases which enter the chamber 10 primarily due to the outgassing of substrate components during the degas process. The vacuum pump 22 functions to exhaust some contaminants from the degas chamber 10.

In a preferred process for depositing aluminum film on a semiconductor substrate 8 having holes or trenches in its top surface, the pedestal heater is operated to heat the pedestal 12 and the substrate 8 to temperatures as high as 650° C. In prior art sputtering systems, such high temperature could not be achieved together with a chamber pressure as low as about $5\times10^{-9}$ to about $7\times10^{-9}$ torr, because at that temperature and pressure the pedestal 12 and perhaps other chamber components would outgas hydrogen at a rate faster than a conventional cryogenic pump could remove it.

In contrast, the getter material 26 of the present invention removes sufficient hydrogen, water and air, as well as other contaminants, by chemisorption to allow the combination of the cryogenic pump 22 and getter material 26 to maintain the degas chamber pressure at about $5\times10^{-9}$ to about $7\times10^{-6}$ torr, preferably $5\times10^{-9}$ to $1\times10^{-8}$ torr. The present invention allows the substrate 8 to be outgassed at a higher temperature, thereby enabling exposure of the substrate to higher temperatures during processing, thus improving step coverage of the deposited film and/or reducing the time which must be allotted for the film to reflow. Such high temperature can be achieved simultaneously with ultra-high vacuum so as to minimize impurities in the deposited film.

The roughing pump 20 and cryogenic pump 22 are of conventional construction. The roughing pump 20 can be a conventional mechanical pump, although other pumps capable of reducing the chamber pressure into the range of $1\times10^{-3}$ torr also would be suitable.

The cryogenic pump 22 preferably includes a conventional condenser array 23 having multiple chevrons through which liquid helium is flown. Gases impinging on the chevrons will condense and flow downwardly on the condenser array to be collected in an exhaust chamber/valve. One such configuration of multiple chevrons in a cryogenic pump is shown in detail in U.S. Pat. No. 4,873,833, Pfeiffer, et al. which is fully incorporated herein by reference.

Figure 3:
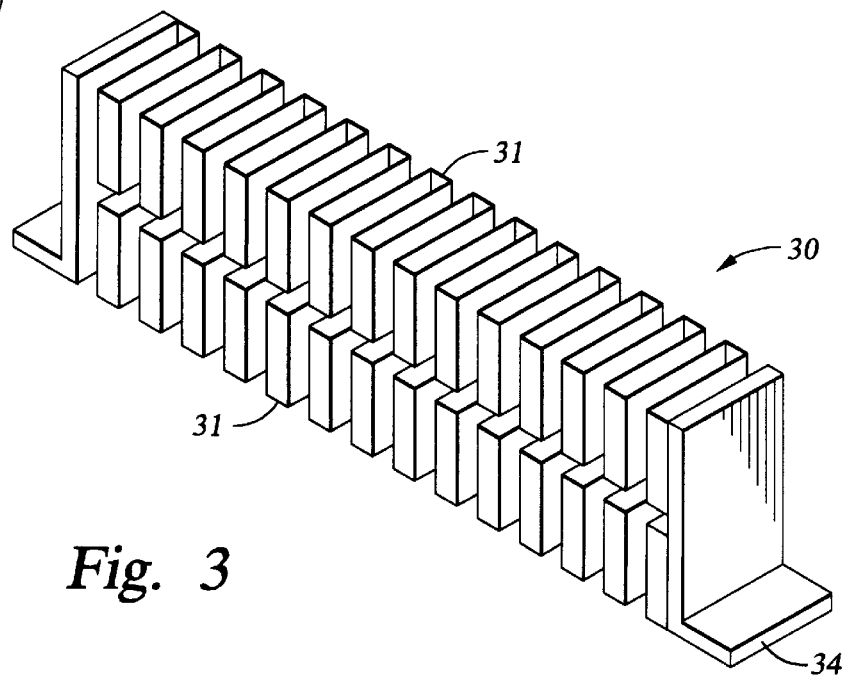
FIG. 3 is a perspective view of an alternative getter material plate configuration useful with the present invention.

Although the invention could be implemented with conventional configuration of getter material configuration, FIGS. 1 and 2 show the details of construction of a preferred getter material 26. The getter material 26 preferably is configured as a pair of rectangular plates 30, although the plates 30 may be formed of a non-gettering base material having the getter material plated or otherwise affixed thereto. Each of the plates 30 is preferably folded into a pleated profile as shown in FIG. 1. Although each of the plates 30 is shown as including one pleated member, multiple pleated members 31 may be stacked to form each of the gettering plates 30 as shown in FIG. 3. Each of the plates 30 terminates, at either end thereof, in a support flange 34, and a rod 36 extends from the chamber base and connects to the support flange 34 to support the plate 30 above the chamber base. An electrical feedthrough 32 extends through the chamber base to provide power to an internal electric resistance heater 13 (shown in FIG. 2) maintained within each of the plates 30.

When a reactive gas species such as water vapor or air contacts either of the plates 30, it is chemisorbed (i.e., gettered) into the plate 30. Thus, as reactive gas species diffuse or migrate within the chamber 10 at the ultra-low chamber pressure, for example at a pressure of less than about $1.5\times10^{-8}$ torr, they are chemisorbed upon contact with the plates. The surface area of the getter material of the plates 30 is sufficiently large to provide chemisorption of the outgassing contaminants and to maintain the lower chamber pressure at about $5\times10^{-9}$ to about $7\times10^{-9}$ torr. However, non-reactive species, such as argon which is commonly used as the process gas, are not absorbed into the getter material.

The getter plates 30 are preferably mounted directly underneath the substrate pedestal 12 as shown in FIGS. 1 and 2 so that the pedestal 12 acts as a shield between the substrate 8 and the getter plates 30. Thus, if any particles should be dislodged from the getter plates 30, such particles will be highly unlikely to lodge on, and thereby contaminate, the substrate 8. The getter plates may be placed elsewhere in the degas chamber so long as the uppermost surface of the plates 30 is located below the upper surface of the substrate 8, where the substrate is positioned on the support member as shown in FIGS. 1 and 2. However, the plates 30 are also positioned as high as possible underneath the substrate 8 so as to minimize the distance between the plates 30 and the substrate 8, and thereby maximize chemisorption of reactive species near the surface of the substrate 8.

The getter material 26 operates by chemisorbing chemically active species such as hydrogen, water and air, but it has virtually no affect on inert gases such as argon which typically are used as the principal process gas for sputtering. Therefore, the gettering material 26 may be used to retrofit existing chambers 10, without the need to reconfigure or recalibrate the gas flows in the chamber 10.

The preferred plate 30 material is a non-evaporable gettering material that may be reactivated by exposure to high temperatures after multiple process cycles in the chamber. One preferred gettering material is a zirconium aluminum material, sold by Saes Getters S.p.A., of Milan, Italy under the designation SORB-AC st101. An additional gettering material that may be used in the degas chamber is also sold by Saes Getters S.p.A., under the designation st707, which is a zirconium vanadium iron alloy. The st101 material is preferred because it has negligible iron content.

Over time, the chemisorption rate of the getter material 26 may decline as a result of the cumulative quantity of reactive species that are chemisorbed into the plates 30. At this point, the gettering material forming, or located over, the plates 30 must be reactivated by heating the plates 30 to a temperature on the order of about 600° C. to about 750° C., for time periods ranging from about 10 to about 1000 minutes, to desorb, or drive out, the hydrogen and other gases absorbed by the plates 30. In the preferred embodiment, this heat is supplied by the electric resistance heater 13 disposed within each plate 30. The time required for desorption is inversely proportional to the temperature of desorption and may be optimized for the particular chamber 10 and getter plate 30 configuration. It is believed that the gettering plates may be desorbed up to five times, before they must be replaced.

The high vacuum enabled by the present invention provides benefit to outgassing processes. Where outgassing is performed in the degas chamber, the lower base pressure obtainable in the chamber reduces the incidence of particle or chemical contamination on the substrate surface. Therefore, it is specifically contemplated that the getter material 26 may be used in a degas chamber of a cluster tool to eliminate contaminants that can come out during wafer exchange or by lack of a slit valve and migrate into the processing chamber.

Although the present invention has been described herein primarily with respect to a high temperature degas chamber, the improved hydrogen and water vapor pumping and the higher temperature ultra high vacuum conditions made possible by the present invention may be used with other equipment or processes where ultra high vacuums and/or high temperatures are desired.

I claim:

1. A method of providing a vacuum in a processing chamber, comprising:
   providing a semiconductor substrate in the processing chamber;
   evacuating the chamber with a vacuum pump, wherein the vacuum pump is alone capable of achieving a first chamber pressure;
   raising the temperature of the semiconductor substrate to outgas contaminants in the semiconductor substrate; and
   removing gaseous material from the processing chamber with a getter material disposed within the processing chamber to achieve a second chamber pressure less than the first chamber pressure.

2. The method of claim 1, wherein the temperature of the substrate exceeds 510° C.

3. The method of claim 1, wherein the second chamber pressure is in the range between about $5 \times 10^{-9}$ and about $7 \times 10^{-9}$ torr.

4. The method of claim 1, further comprising:
   providing a substrate support member having a substrate support surface to the processing chamber; and
   locating the substrate support member intermediate the substrate support surface and the getter material.

5. The method of claim 1, wherein the second chamber pressure in the processing chamber is maintained at a pressure below about $7 \times 10^{-9}$ torr when raising the temperature of the substrate to outgas contaminants.

6. The method of claim 1, further comprising evacuating the processing chamber with a roughing pump to a pressure below atmospheric pressure and above the first chamber pressure.

7. The method of claim 1, wherein the first chamber pressure is greater than about $7 \times 10^{-9}$ Torr.

8. The method of claim 1, further comprising heating the getter material to a temperature between about 600° C. and about 750° C. to desorb gaseous material.

9. The method of claim 1, wherein the gaseous material comprises contaminants selected from the group of hydrogen, water, oxygen, nitrogen, reactive gases, and combinations thereof.

10. A method of outgassing contaminants at high vacuum and high temperature, comprising:
    providing a processing chamber;
    evacuating the processing chamber with a vacuum pump, wherein the vacuum pump is alone capable of achieving a first chamber pressure;
    absorbing contaminants in the chamber with a getter material to achieve a second chamber pressure less than the first chamber pressure;
    providing a semiconductor substrate in the chamber; and
    raising the temperature of the substrate to outgas contaminants in the substrate.

11. The method of claim 10, wherein the first chamber pressure is greater than about $7 \times 10^{-9}$ Torr and the second chamber pressure is in the range between about $5 \times 10^{-9}$ and about $7 \times 10^{-9}$ Torr.

12. The method of claim 10, further comprising:
    providing a substrate support member having a substrate support surface to the processing chamber; and
    locating the substrate support member intermediate the substrate support surface and the getter material.

13. The method of claim 10, further comprising evacuating the processing chamber with a roughing pump to a pressure below atmospheric pressure and above the first chamber pressure.

14. A method of providing a vacuum in a processing chamber, comprising:
    evacuating the processing chamber with a vacuum pump, wherein the vacuum pump is alone capable of achieving a first chamber pressure;
    pumping the chamber with a getter material to achieve a second chamber pressure less than the first chamber pressure;
    providing a substrate in the processing chamber; and
    raising the temperature of the substrate to outgas contaminants in the substrate.

15. The method of claim 14, wherein the first chamber pressure is greater than about $7 \times 10^{-9}$ Torr and the second chamber pressure is in the range between about $5 \times 10^{-9}$ and about $7 \times 10^{-9}$ Torr.

16. The method of claim 14, further comprising:
    providing a substrate support member having a substrate support surface to the processing chamber; and
    locating the substrate support member intermediate the substrate support surface and the getter material.

17. The method of claim 14, further comprising evacuating the processing chamber with a roughing pump to a pressure below atmospheric pressure and above the first chamber pressure.

* * * * *

UNITED STATES PATENT AND TRADEMARK OFFICE
CERTIFICATE OF CORRECTION

PATENT NO. : 6,361,618 B1
DATED : March 26, 2002
INVENTOR(S) : Jaim Nulman

It is certified that error appears in the above-identified patent and that said Letters Patent is hereby corrected as shown below:

Column 3,
Line 39, please change "substrte" to -- substrate --.

Signed and Sealed this

Thirty-first Day of December, 2002

JAMES E. ROGAN
*Director of the United States Patent and Trademark Office*